(12) United States Patent
Nakashima et al.

(10) Patent No.: US 6,599,834 B2
(45) Date of Patent: Jul. 29, 2003

(54) PROCESS OF MANUFACTURING A SEMICONDUCTOR DEVICE WITH AN ELECTROPLATED WIRING LAYER

(75) Inventors: Toshiyuki Nakashima, Nara (JP); Masahiro Shiota, Souraku-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/155,116

(22) Filed: May 28, 2002

(65) Prior Publication Data

US 2002/0177305 A1 Nov. 28, 2002

(30) Foreign Application Priority Data

May 28, 2001 (JP) .......................... 2001-159189

(51) Int. Cl.[7] .............................................. H01L 21/445

(52) U.S. Cl. ....................................................... 438/674

(58) Field of Search ............................... 438/652, 674, 438/675, 686, 687, 688

(56) References Cited

U.S. PATENT DOCUMENTS

| 5,316,974 | A | * | 5/1994 | Crank ........................ 437/190 |
| 6,030,890 | A | * | 2/2000 | Iwabuchi .................... 438/613 |
| 6,140,234 | A | * | 10/2000 | Uzoh et al. ................. 438/678 |
| 6,278,153 | B1 | * | 8/2001 | Kikuchi et al. ............. 257/310 |
| 6,448,660 | B2 | * | 9/2002 | Shibata ....................... 257/777 |
| 2001/0019865 | A1 | * | 9/2001 | Erdeljac et al. ............. 438/239 |

FOREIGN PATENT DOCUMENTS

JP  2-3926 A  * 1/1990  ....... H01L/21/3205

* cited by examiner

Primary Examiner—Wael Fahmy
Assistant Examiner—Stephen W. Smoot
(74) Attorney, Agent, or Firm—Nixon & Vanderhye, P.C.

(57) ABSTRACT

A process of manufacturing a semiconductor device including the steps of: filling a photoresist in a concave portion provided on a surface of a semiconductor substrate; forming a power-feeding thin metal film for electrolytic plating on the semiconductor substrate including a surface of the thus filled photoresist; and forming wiring on the power-feeding thin metal film in a region not above the concave portion by electrolytic plating.

18 Claims, 2 Drawing Sheets

PROCESS OF MANUFACTURING A SEMICONDUCTOR DEVICE WITH AN ELECTROPLATED WIRING LAYER

CROSS-REFERENCE TO RELATED APPLICATION

This application is related to Japanese Patent Application No. 2001-159189 filed on May 28, 2001, whose priority is claimed under 35 USC §119, the disclosure of which is incorporated by reference in its entirety.

BACKGROUND OF THE INVENTION

1. Field of the Invention

The present invention relates to a process of manufacturing a semiconductor device. More particularly, it relates to a process of manufacturing a semiconductor device in which wiring is formed on a surface of a semiconductor substrate by electrolytic plating.

2. Description of Related Art

Low resistance metals such as precious metals (e.g., Au) are commonly used as wiring materials used for semiconductor devices such as high frequency transistors and ICs. Use of such low resistance metals reduces loss of propagation of a high frequency wave. When an expensive precious metal is used, preferably the wiring is formed by a plating method rather than by a metal lift-off method since, e.g., the former uses the material more efficiently and is advantageous in increasing the thickness of the wiring. The metal lift-off method, on the other hand, causes a large waste of the material.

FIGS. 2(a) to 2(d) are sectional views illustrating the steps of manufacturing the wiring by a conventional plating method.

First, as seen in FIG. 2(a), scribe lines 24a for separating semiconductor element regions 24b are formed as described below. In a semiconductor substrate 21 on which the wiring will be formed, a semiconductor element such as a transistor has been incorporated (not shown). On the semiconductor substrate 21, an insulating film 22 is formed. The insulating film 22 can easily be processed into a mask used for etching the substrate or forming electrodes during the manufacture of the semiconductor device. Further, another insulating film 23, which is denser in film quality than the insulating film 22, is layered on the insulating film 22 to cover the entire semiconductor element for the purpose of enhancing reliability of the semiconductor element, e.g., resistance to moisture. The scribe lines 24a are formed by removing the insulating films 22 and 23 by etching or the like.

Then, a power-feeding thin metal film 25, which will be a common electrode for electrolytic plating, is formed over the insulating films 22 and 23, as well as the exposed semiconductor substrate (see FIG. 2(b)).

Next, a photoresist film 26 having openings only in regions for forming the wiring is formed on the power-feeding thin metal film 25. Then, the electrolytic plating is carried out by using the photoresist film 26 as a mask, thereby forming plated wiring 27 only in the openings in which the power-feeding thin metal film 25 is exposed (see FIG. 2(c)).

Thereafter, the photoresist film 26 is removed. Then, the power-feeding thin metal film 25 which unnecessarily remains in a region not below the plated wiring 27 is etched away by using the plated wiring 27 as a mask (see FIG. 2(d)).

Through the thus described steps, the plated wiring is formed only in a required region on the semiconductor substrate.

However, the above-described steps of forming the wiring sometimes cause the following disadvantage. More specifically, a concave portion existing on the semiconductor substrate, i.e., the scribe line 24a for separating the semiconductor elements, is formed by the etching of the insulating films 22 and 23. Among the insulating films 22 and 23, the easily processable insulating film 22 which is located below the insulating film 23 is etched at an etching rate higher than that of the upper insulating film 23 provided for enhancing the reliability such as resistance to moisture. Therefore, the side wall of the concave portion will be in an inverse tapered shape in which an edge on an upper side is protruded inward as compared with an edge on a bottom side. This is disadvantageous because the power-feeding thin metal film for electrolytic plating tends to be torn at the concave portion.

In the above-described case, the tearing of the power-feeding thin metal film can be inhibited by reducing the depth of the concave portion or increasing the thickness of the power-feeding thin metal film. However, the depth of the concave of the scribe line is determined by the thicknesses of the insulating films required in the course of the manufacture of the semiconductor device. Therefore, in order to reduce the depth, the manufacture process itself needs to be altered, which is not easy.

On the other hand, the increase of the thickness of the power-feeding thin metal film results in an increase of working time and an amount of the material to be used, which leads to an increase of the cost. Even if the depth of the scribe line is reduced or the thickness of the power-feeding thin metal film is increased, the shape of the power-feeding thin metal film at the concave portion is still unstable and fraught with possibility of the tearing. If the electrolytic plating is carried out with respect to the semiconductor element in which the power-feeding thin metal film has been torn at the concave portion, electric current is not supplied to a region where the plated wiring shall be formed, and thus the plated wiring cannot be formed. Further, the electric current which should be supplied to the above-described element is supplied to a semiconductor element in which the tearing of the film has not occurred, which may produce the plated wiring having a thickness greater than a predetermined thickness.

This implies not only the fact that an element in which the tearing of the film has occurred (and thus the plated wiring has not been formed) becomes a failed element, but also a possibility that the failed element impairs an element in which the tearing of the film has not occurred.

SUMMARY OF THE INVENTION

In view of the above-mentioned circumstances, the present invention provides a process capable of preventing the power-feeding thin metal film for electrolytic plating from tearing at the concave portion, and instead forming the plated wiring on the semiconductor substrate with stability.

Thus, according to the present invention, provided is a process of manufacturing a semiconductor device comprising the steps of: filling a photoresist in a concave portion provided on a surface of a semiconductor substrate; forming a power-feeding thin metal film for electrolytic plating on the semiconductor substrate including a surface of the thus filled photoresist; and forming wiring on the power-feeding thin metal film in a region not above the concave portion by electrolytic plating.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
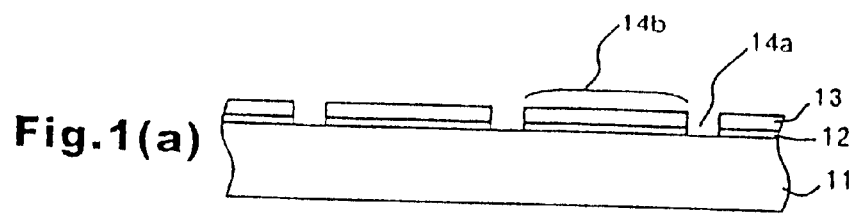
FIGS. 1(a) to 1(f) are schematic sectional views illustrating the steps of manufacturing a semiconductor device according to the present invention.
Figure 1B:
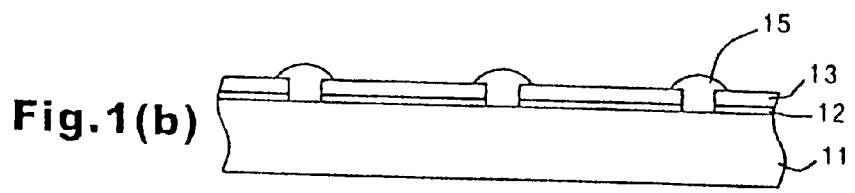
Figure 1C:
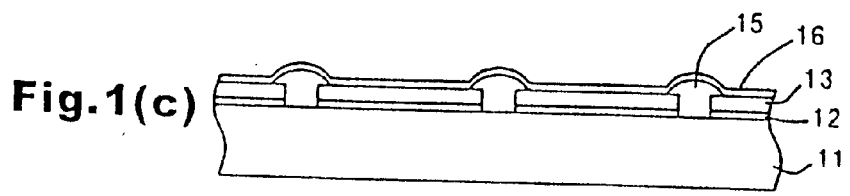
Figure 1D:
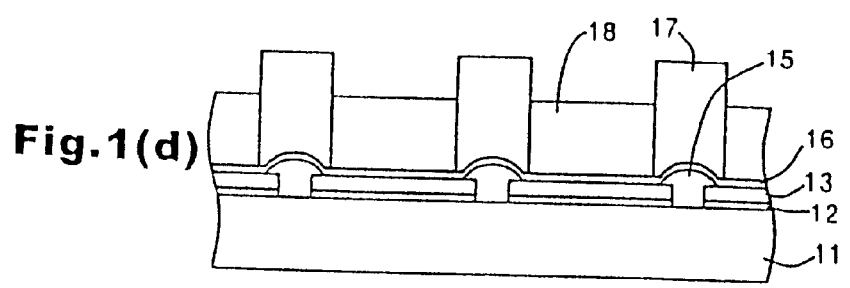
Figure 1E:
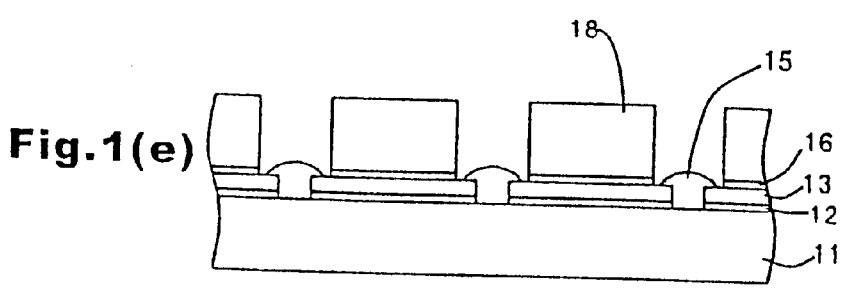

Hereinafter, the process of manufacturing the semiconductor device according to the present invention will be described.

First, a concave portion provided on a surface of a semiconductor substrate is filled with a photoresist.

The semiconductor substrate used in the present invention is not particularly limited and any known semiconductor substrate may be used. For example, element substrates such as Si substrates, and compound substrates such as GaAs substrates may be used. Also available are substrates of glass or metal on which a semiconductor layer of Si or GaAs is laminated. On the semiconductor substrate, various layers that constitute the semiconductor element (e.g., a gate insulating film, a gate electrode, an interlayer insulating film, a wiring layer and the like) may be formed.

According to the present invention, the semiconductor substrate has the concave portion on its surface. The concave portion may be formed on the semiconductor substrate itself, or may be formed in a semiconductor layer formed on the semiconductor substrate. The concave portion according to the present invention may be a scribe line for separating semiconductor elements. The depth of the concave portion varies depending on a thickness of a power-feeding thin metal film to be formed later. The manufacturing process of the present invention shows an effect of preventing tearing of the film when the depth of the concave portion is as great as possible. More specifically, the process of the present invention is effective when the depth of the concave portion is greater than the thickness of the power-feeding thin metal film to be formed later. It is preferable that the depth of the concave portion be greater than the thickness of the power-feeding thin metal film by 30 nm or more.

The present invention is also effective when the side wall of the concave portion is so shaped that an edge on an upper side is protruded in the form of eaves as compared with an edge on a bottom side.

The concave portion on the surface of the semiconductor substrate is filled with a photoresist. In this context, "fill" means that the photoresist is formed at least to a thickness which compensates the concave portion. More specifically, the photoresist has a thickness which covers the concave portion. It is preferred that the photoresist has such a thickness that is greater than the depth of the concave portion and is able to cover the surface of the semiconductor substrate around the concave portion. Further, it is also preferable that the photoresist has such a thickness that allows the surface of the semiconductor substrate to be exposed in a region for forming wiring in a later step because the steps of patterning the photoresist are reduced.

The photoresist used in the present invention is not particularly limited and any known photoresist may be used. Specifically, as explained below, a positive photoresist is preferable because it is capable of forming a cured layer on its surface through the irradiation with light.

The photoresist filled in the concave portion is preferably subjected to a post-bake treatment. Through this treatment, the photoresist is transformed into a tapered shape having a thickness greater at the center thereof than in the periphery portion. The taper-shaped photoresist effectively inhibits the tearing of a power-feeding thin metal film to be formed later. If the treatment temperature is too low, the photoresist may be tapered insufficiently, or be deformed due to stress applied by the power-feeding thin metal film to be formed later or a photoresist for forming the wiring. On the other hand, if the treatment temperature is too high, the photoresist filled in the concave portion cannot be exfoliated easily in a final step. Specifically, the temperature for the post-bake treatment is preferably 155 to 175° C., though it varies depending on the kind of the photoresist to be used.

It is preferred to form a cured layer at least on the surface of the photoresist by irradiating the photoresist with light after or simultaneously with a post-bake treatment. The light used for the irradiation may be selected depending on the kind of the photoresist. For example, deep ultraviolet rays having a wavelength of 220 to 320 nm and an intensity of 550±55 mW/cm$^2$ may be used. If the irradiation time is too short, as in the same manner as the above treatment, the photoresist may be deformed due to stress applied by the power-feeding thin metal film to be formed later or a photoresist for forming the wiring. On the other hand, if the irradiation time is too long, the photoresist filled in the concave portion cannot be exfoliated easily in a final step. Specifically, the irradiation time is preferably 20 to 30 seconds, though it varies depending on the kind of the photoresist to be used.

Then, on the semiconductor substrate including the surface of the photoresist filled in the concave portion, a power-feeding thin metal film for electrolytic plating is formed. At this time, the tearing of the power-feeding thin metal film, which has been occurred heretofore, is inhibited because the concave portion has been covered with the photoresist.

The power-feeding thin metal film may be made of any metal as long as it closely contacts the underlying film and conforms to the wiring formed thereon by the electrolytic plating. Alloys may be used. Further, the power-feeding thin metal film may be single layered or multilayered. Specifically, the power-feeding thin metal film may be constituted of a selected metal such as Ti, Al or the like. A method for forming the power-feeding thin metal film is not particularly limited, and any known method such as electron beam vapor deposition, electroless plating and the like may be used.

Next, wiring is formed on the power-feeding thin metal film in a region not above the concave portion by the electrolytic plating. Since the process of the present invention inhibits the tearing of the power-feeding thin metal film at the concave portion, variation in thickness of the wiring caused by lack or excess of power supply is controlled.

The wiring may be made of any metal as long as it is formed by the electrolytic plating. For example, Au, Cu or the like may be used. The thickness of the wiring is not particularly limited and may suitably be selected depending on its application.

In order to form the wiring in the region not above the concave portion, for example, a photoresist is formed to cover the concave portion and then the electrolytic plating is carried out by using the photoresist as a mask.

After the formation of the wiring, the photoresist and the power-feeding thin metal film located above the concave portion may be removed. The photoresist may be removed by using an organic release agent, for example. The power-feeding thin metal film may be removed by using an etchant selected in accordance with the metal used.

EXAMPLE

Hereinafter, an example of the process of manufacturing the semiconductor device according to the present invention is described in detail with reference to the figures. However, the present invention is not limited thereto.

FIGS. 1(a) to 1(f) are schematic sectional views illustrating the steps of the process of manufacturing the semiconductor device according to the example.

On a GaAs substrate 11 used as a semiconductor substrate, semiconductor elements such as transistors have been formed (not shown). At this time, a $SiO_2$ film of 200 nm thick is formed thereon as a first insulating film 12, which can easily be processed into a mask used for etching the substrate or forming electrodes during the manufacture of the semiconductor elements. Further, a SiN film of 300 nm thick, which is denser in film quality than the first insulating film 12, is formed thereon as a second insulating film 13 to cover the entire elements. The second insulating film 13 is formed to enhance reliability of the elements, e.g., resistance to moisture. Then, the first and second insulating films 12 and 13 are removed by etching from regions for separating semiconductor elements 14b, thereby forming scribe lines 14a (see FIG. 1(a)).

Then, a photoresist is applied on the entire surface to a thickness of 1 μm, for example, by photolithography, and filled as a first photoresist 15 in the scribe lines such that the first photoresist 15 having a size larger than the scribe lines covers the scribe lines, without exposing the edges of the scribe lines.

Then, the thus filled first photoresist 15 is subjected to a post-bake treatment at 165° C. for 2 minutes, thereby the first photoresist 15 is taper-shaped having a thickness greater at the center thereof than in a periphery portion. Further, the first photoresist 15 is irradiated with deep ultraviolet (D-UV) rays of 550±55 mW/cm² at a wavelength of 220 to 320 nm for 25 seconds, thereby forming a cured layer on the surface of the first photoresist 15 (see FIG. 1(b)).

Subsequently, on the entire surface including the first photoresist 15, a power-feeding thin metal film 16 for electrolytic plating is formed. The power-feeding thin metal film 16 is made of a laminate of a Ti film of 50 nm thick and a Au film of 100 nm, which are formed in this order by electron beam vapor deposition (see FIG. 1(c)).

Then, a second photoresist 17 is applied on the entire surface by photolithography as a mask for the plating and openings are formed in regions where wiring will be formed by the plating. Using the second photoresist 17 as a mask, Au is electrolytically plated, thereby forming plated Au wiring 18 in the openings of the second photoresist 17 in which the power-feeding thin metal film is exposed (see FIG. 1(d)).

Then, the second photoresist 17 is removed by using an organic release agent to expose the power-feeding thin metal film 16 in a region not below the plated wiring 18. Further, the power-feeding thin metal film 16 in the region not below the plated wiring 18, which is not necessary any more, is removed by using the plated wiring 18 as a mask. The removal of the power-feeding thin metal film 16 is performed by wet etching, using an etchant made of iodine and ammonium iodide for removing the Au film, and an etchant made of phosphoric acid warmed to about 80° C. for removing the Ti film (see FIG. 1(e)).

Figure 1F:
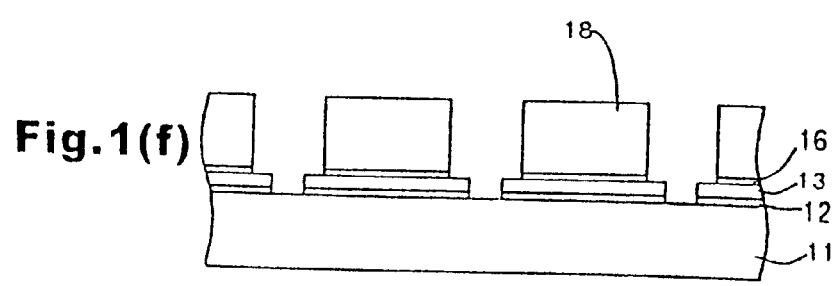
Figure 2A:
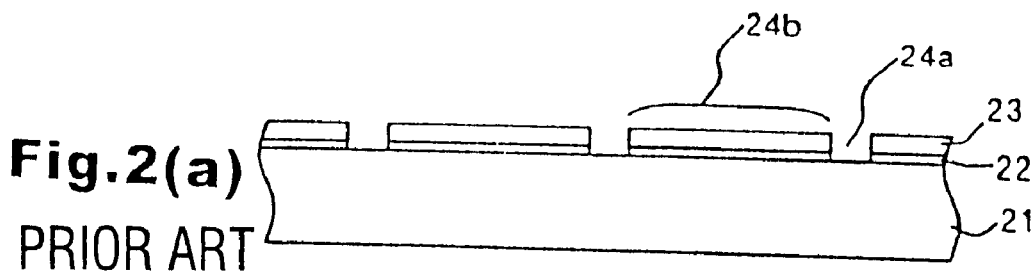
FIGS. 2(a) to 2(d) are schematic sectional views illustrating the steps of manufacturing a semiconductor device according to the prior art.
Figure 2B:
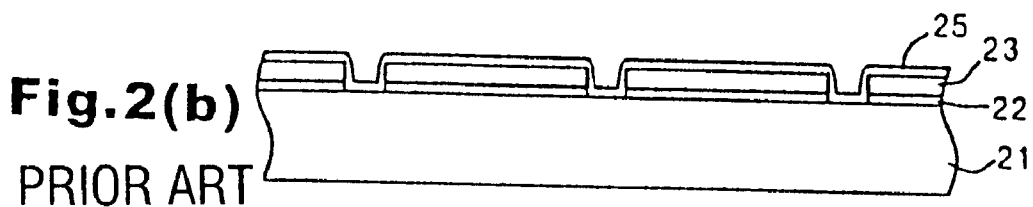
Figure 2C:
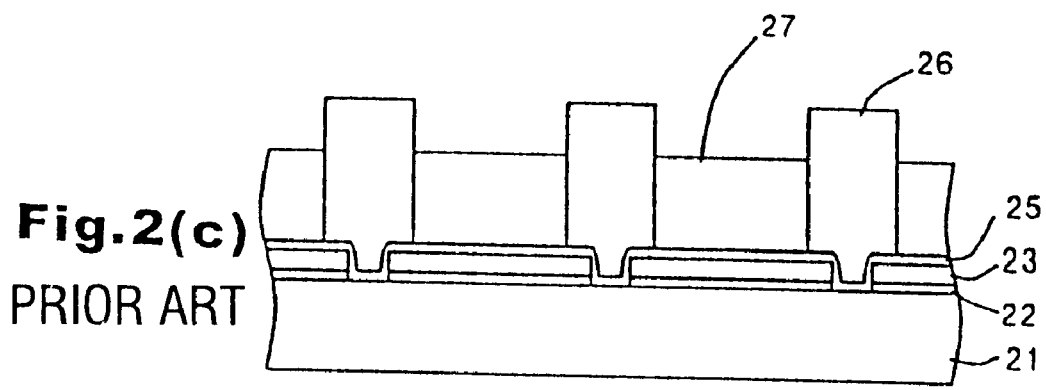
Figure 2D:
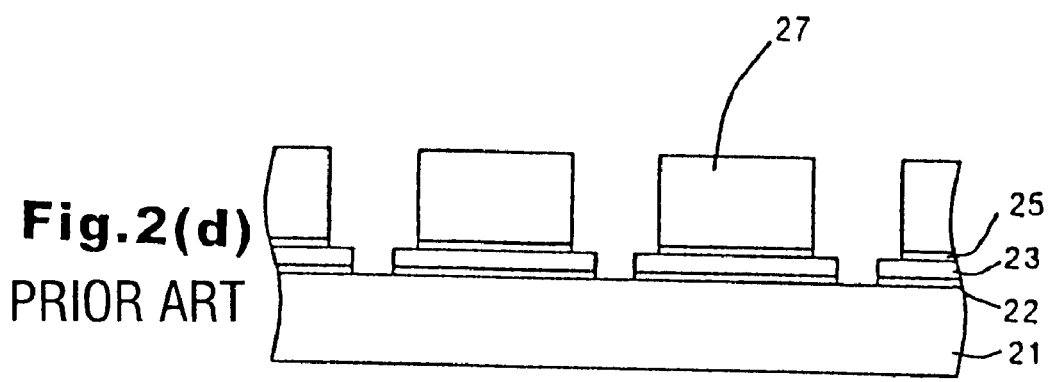

In the final step, the first photoresist 15 filled in the scribe lines is removed by using an organic release agent (see FIG. 1(f)).

Thus, since the taper-shaped photoresist 15 has been filled in the scribe lines during the formation of the power-feeding thin metal film 16, the power-feeding thin metal film 16 is prevented from tearing at the concave portion. This prevents the formation of elements in which the plated wiring is not formed, or the formation of elements having the plated wiring of a thickness greater than a predetermined thickness. Therefore, the plated wiring can be formed uniformly on the entire surface of the substrate.

More specifically, the device according to the example of the present invention reduces the rate of breaking of the wiring after the formation of the power-feeding thin metal film to about 0%, whereas it has been occurred at a rate of 88.9% in the device manufactured by the prior art process shown in FIGS. 2(a) to 2(d).

FIGS. 1(a) to 1(f) appear to show that a single wiring structure is formed over the entire semiconductor element region. However, the figures are schematically illustrated and the wiring is actually in the form of a fine pattern.

According to the present invention, the photoresist is filled in the concave portion formed on the semiconductor substrate. This prevents the tearing of the power-feeding thin metal film for electrolytic plating to be formed on the semiconductor substrate. As a result, the wiring can be formed in a uniform thickness by the electrolytic plating, which prevents the formation of regions without the wiring or regions with the wiring of excessive thickness.

What is claimed is:

1. A process of manufacturing a semiconductor device comprising the steps of:
    filling a photoresist in a concave portion provided on a surface of a semiconductor substrate;
    forming a power-feeding thin metal film for electrolytic plating on the semiconductor substrate including over a surface of the thus filled photoresist; and
    forming wiring on the power-feeding thin metal film in a region not above the concave portion by electrolytic plating.

2. A process according to claim 1, wherein the photoresist filled in the concave portion is in a tapered shape having a thickness greater at a center thereof than in a periphery portion.

3. A process according to claim 1, wherein a side wall of the concave portion is so shaped that an edge on an upper side is protruded in the form of eaves as compared with an edge on a bottom side.

4. A process according to claim 1, wherein the concave portion has a depth greater than a thickness of the power-feeding thin metal film.

5. A process according to claim 1, wherein the concave portion is a scribe line for separating semiconductor elements.

6. A process according to claim 4, wherein the depth of the concave portion is greater than the thickness of the power-feeding thin metal film by 30 nm or more.

7. A process according to claim 1, further comprising the step of irradiating the
photoresist with deep ultraviolet rays, before the formation of the power-feeding thin metal film, after or simultaneously with a post-bake treatment.

8. A process according to claim 7, wherein the photoresist has a cured layer formed on its surface by irradiating the photoresist with deep ultraviolet rays.

9. A process according to claim 1, wherein the photoresist is removed together with the power-feeding thin metal film formed thereon after the electrolytic plating.

10. A process of manufacturing a semiconductor device comprising the steps of:
   filling a photoresist in a scribe line formed on a surface of a semiconductor substrate;
   forming a power-feeding thin metal film on the semiconductor substrate including over a surface of the thus filled photoresist; and
   using the power-feeding thin metal film as an electrode in an electrolytic plating operation to form a wiring over at least a portion of the substrate.

11. A process according to claim 10, wherein the photoresist filled in the scribe line has a tapered shape with a thickness greater at a center thereof than in a periphery portion.

12. A process according to claim 10, wherein a side wall of the scribe line is so shaped that an edge on an upper side is protruded in the form of eaves as compared with an edge on a bottom side.

13. A process according to claim 10, wherein the scribe line has a depth greater than a thickness of the power-feeding thin metal film.

14. A process according to claim 10, wherein the scribe line separates semiconductor elements.

15. A process according to claim 14, wherein the depth of the scribe line is greater than the thickness of the power-feeding thin metal film by 30 nm or more.

16. A process according to claim 10, further comprising the step of irradiating the photoresist with deep ultraviolet rays, before the formation of the power-feeding thin metal film, after or simultaneously with a post-bake treatment.

17. A process according to claim 16, wherein the photoresist has a cured layer formed on its surface by irradiating the photoresist with deep ultraviolet rays.

18. A process according to claim 10, wherein the photoresist is removed together with the power-feeding thin metal film formed thereon after the electrolytic plating.

* * * * *